(12) United States Patent
Chen et al.

(10) Patent No.: US 11,246,225 B2
(45) Date of Patent: Feb. 8, 2022

(54) CIRCUIT BOARD WITH HIGH REFLECTIVITY AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Wen-Qiang Chen, Huaian (CN); Ming-Hua Du, Qinhuangdao (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 29 days.

(21) Appl. No.: 16/916,068

(22) Filed: Jun. 29, 2020

(65) Prior Publication Data
US 2021/0392757 A1 Dec. 16, 2021

(30) Foreign Application Priority Data

Jun. 12, 2020 (CN) .......................... 202010540117.4

(51) Int. Cl.
| H05K 1/05 | (2006.01) |
| H05K 3/40 | (2006.01) |
| H05K 3/34 | (2006.01) |
| H05K 3/12 | (2006.01) |
| F21V 23/00 | (2015.01) |

(52) U.S. Cl.
CPC ......... *H05K 3/4007* (2013.01); *H05K 3/1258* (2013.01); *H05K 3/3436* (2013.01); *F21V 23/004* (2013.01)

(58) Field of Classification Search
CPC .. H05K 3/4007; H05K 3/1258; H05K 3/3436; F21V 23/004
USPC ........................................................ 174/257
See application file for complete search history.

(56) References Cited

U.S. PATENT DOCUMENTS

| 2013/0161085 A1* | 6/2013 | Oh .......................... H01L 24/11 174/267 |
| 2015/0195905 A1* | 7/2015 | Kang .................... H05K 3/4644 361/763 |
| 2017/0303396 A1* | 10/2017 | Nishioka ................. G03F 7/038 |

* cited by examiner

*Primary Examiner* — Tremesha S Willis
(74) *Attorney, Agent, or Firm* — ScienBiziP, P.C.

(57) ABSTRACT

A circuit board having a high reflectivity includes a wiring board, a first solder resist layer, and a second solder resist layer. The wiring board includes a wiring layer on an outer side, the wiring layer including wiring and a bond pad spaced from the wiring. The first solder resist layer, with opening and groove, covers the wiring layer, the bond pad is exposed from the opening but spaced from the first solder resist layer. The second solder resist layer infills the groove and covers the first solder resist layer but does not make contact with the mounting surface of the bond pad. A method for manufacturing such circuit board is also disclosed.

10 Claims, 7 Drawing Sheets

CIRCUIT BOARD WITH HIGH REFLECTIVITY AND METHOD FOR MANUFACTURING THE SAME

FIELD

The subject matter herein generally relates to circuit boards, in particular to a circuit board with high reflectivity and a method for manufacturing the same.

BACKGROUND

In an LED display device, a LED lamp can be surface-mounted on a circuit board. To improve the light emitting efficiency of the LED lamp, solder resist ink can be printed multiple times on the circuit board to obtain a thick layer of solder resist ink which will better reflect the light from the LED. However, when the solder resist ink is printed multiple times, it can easily overflow to the bond pads for mounting the LED lamp, resulting in contamination of the circuit board.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

One embodiment of a method for manufacturing a circuit board having a high reflectivity includes the following steps of:

S1, providing a wiring board including a wiring layer on an outer side, the wiring layer including wiring and a bond pad spaced from the wiring, the bond pad including a mounting surface on an outer side;

S2, forming a first solder resist layer on the wiring layer;

S3, forming an opening and a groove on the first solder resist layer, the bond pad being exposed from the opening and spaced from the first solder resist layer;

S4, forming a second solder resist layer on the first solder resist layer, the second solder resist layer infilling the groove and not being in contact with the mounting surface of the bond pad, thereby obtaining the circuit board having a high reflectivity.

Figure 1:
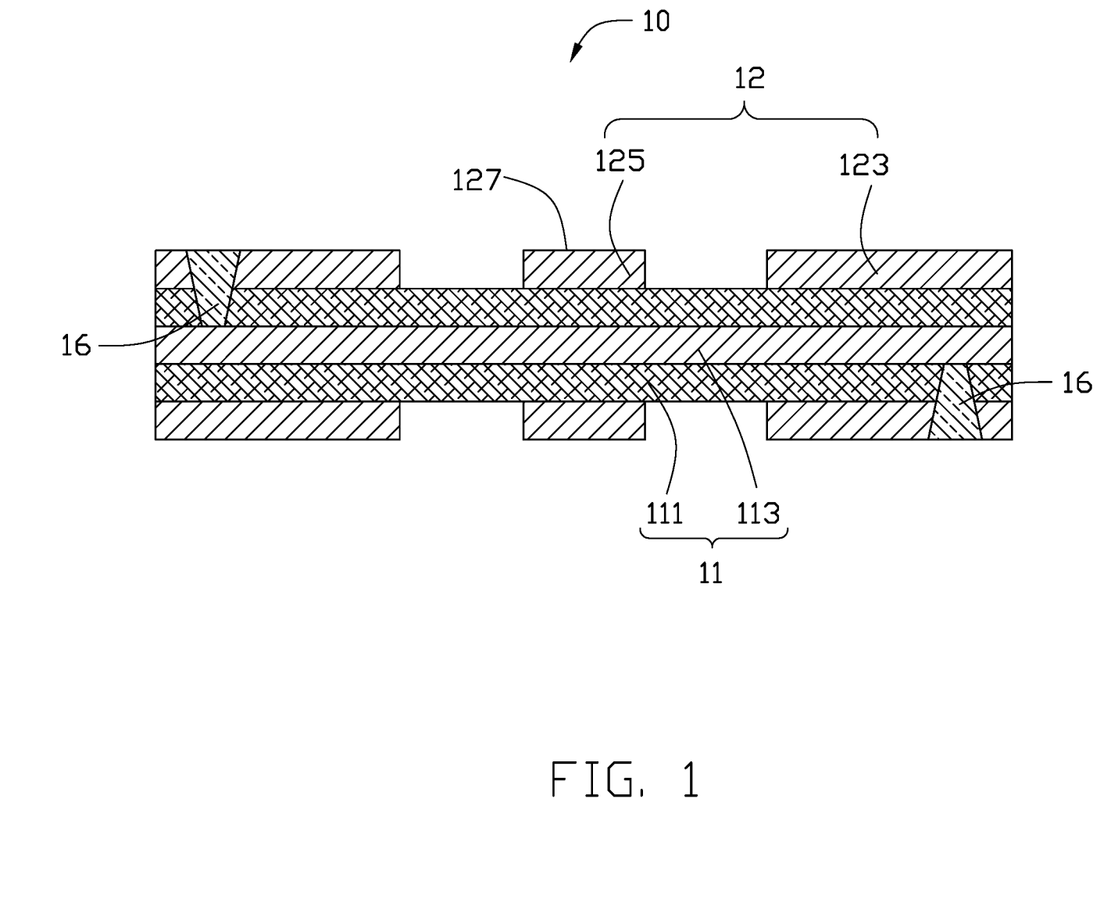
FIG. 1 is a cross-sectional view of an embodiment of a wiring board.

Referring to FIG. 1, in step S1, a wiring board 10 is provided. The wiring board 10 includes a wiring layer 12 on an outer side. The wiring layer 12 includes wiring 123 and a bond pad 125 spaced from the wiring 123. The bond pad 125 includes a mounting surface 127 on an outer side.

A surface-mounted component, such as a LED, is mounted on the mounting surface 127 of the bond pad 125 to be electrically connected to the wiring board 10. The wiring 123 is not in contact with the surface-mounted component. The wiring 123 is configured to transmit electrical signals.

The wiring board 10 further includes a substrate 11, the wiring layer 12 is disposed on at least one side of the substrate 11. In the embodiment, the wiring layer 12 is disposed on both sides of the substrate 11, the wiring layer 12 is made of copper.

The substrate 11 may have a single-layer structure or a multi-layer structure, and may be a flexible board, a rigid board, or a flexible-rigid board. In the embodiment, the substrate 11 includes two insulating layers 111 and a wiring layer 113 sandwiched between the insulating layers 111. In an alternative embodiment, the number of insulating layer 111 and of wiring layer 113 in the substrate 11 may be set according to needs.

The insulating layer 111 includes at least one of prepreg including glass fiber and epoxy resin, polyimide, polyethylene terephthalate, polyethylene naphthalate.

The wiring board 10 further includes a plurality of conductive structures 16 for electrically connecting various wiring layers. Specifically, each of the conductive structures passes through one wiring layer 12 and one insulating layer 111, and electrically connects the wiring layer 12 on the outer side and the wiring layer 113 of the substrate 11.

Figure 2:
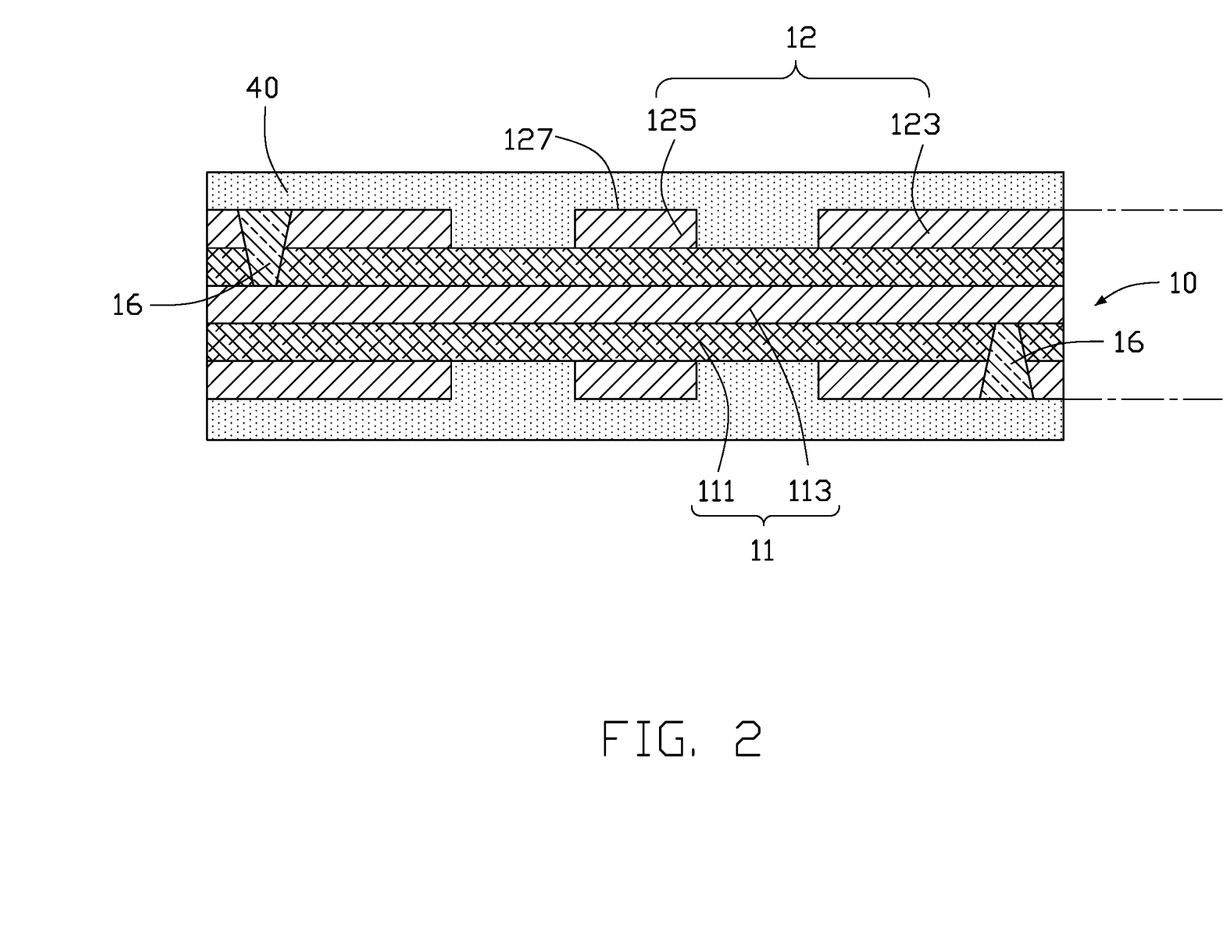
FIG. 2 is a cross-sectional view showing a first solder resist layer formed on the wiring board of FIG. 1.

Referring to FIG. 2, in step S2, a first solder resist layer 40 is formed on the wiring layer 121.

The first solder resist layer 40 completely covers the wiring layer 12 and infills the gap between the bond pad 125 and the wiring 123. The first solder resist layer 40 may be formed by printing.

The first solder resist layer 40 is made of ink, such as soft ink or hard ink. In the embodiment, the first solder resist layer 40 is made of white photosensitive ink for high reflectivity and to enable the first solder resist layer 40 to be patterned by using a photo-lithography method.

Figure 3:
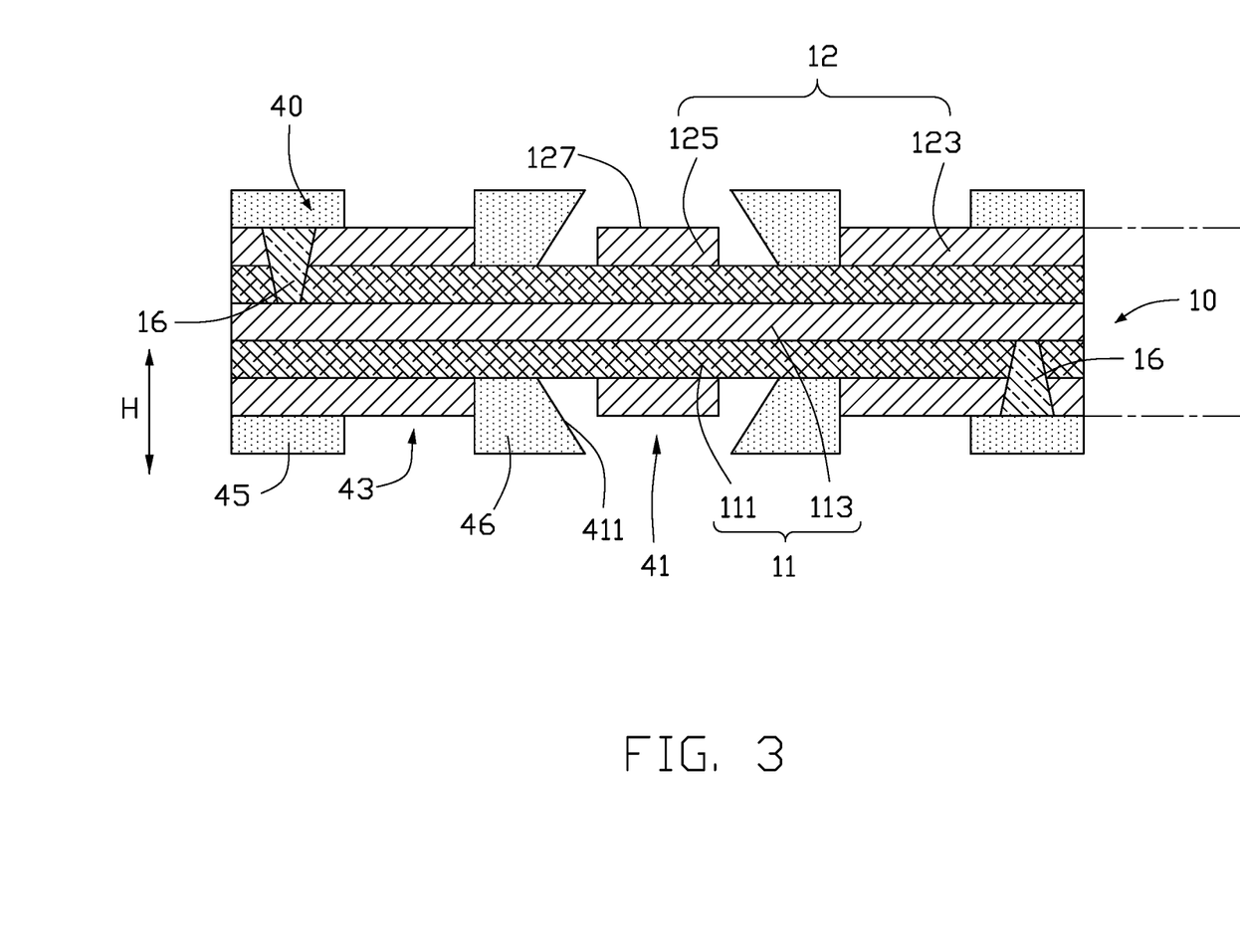
FIG. 3 is a cross-sectional view showing a groove and an opening formed on the structure shown in FIG. 2.

Referring to FIG. 3, in step S3, an opening 41 and a groove 43 is formed on the first solder resist layer 40, and the bond pad 125 is exposed from the opening 41 and spaced from the first solder resist layer 40.

The opening 41 passes through the first solder resist layer 40, and a part of the substrate 11 and the bond pad 125 are exposed from the opening 41. The opening 41 includes a sidewall 411 spaced from the bond pad 125. In the embodiment, the sidewall 411 is inclined relative to the substrate 11.

The groove 43 passes through the first solder resist layer 40, and the wiring 123 is exposed from the groove 43. The groove 43 is arranged around the opening 41, and divides the first solder resist layer 40 into a first portion 45 and a second portion 46 spaced from the first portion 45. The second portion 46 is arranged adjacent to the bond pad 125. In the embodiment, the second portion 46 is received in the gap between the bond pad 125 and the wiring 123. In an alternative embodiment, projections of the second portion 46 and the bond pad 125 along a thickness direction H of the circuit board 100 do not overlap.

The opening 41 and the groove 43 may be formed on the first solder resist layer 40 by using a photo-lithography method.

Figure 4:
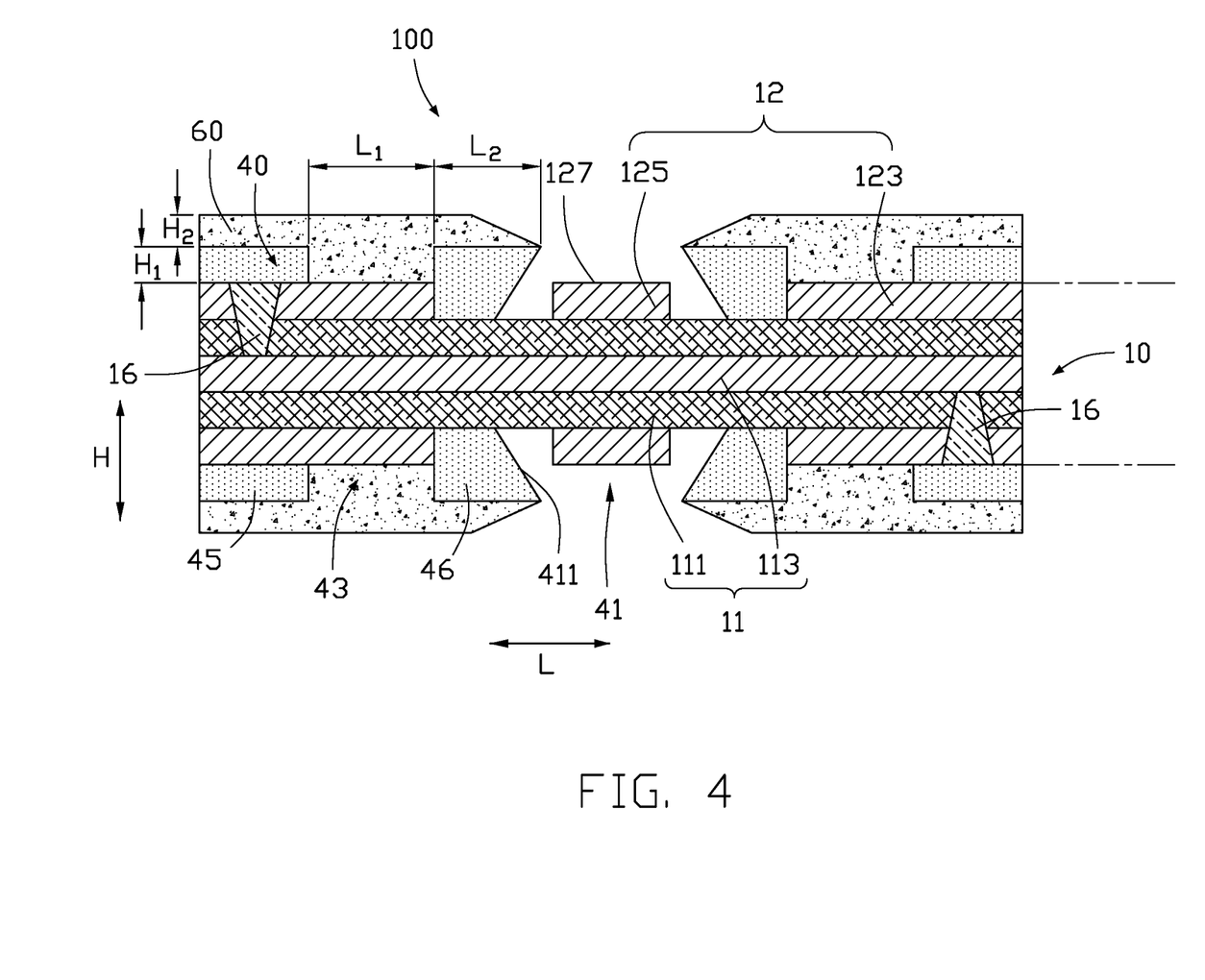
FIG. 4 is a cross-sectional view of a circuit board having a high reflectivity obtained by forming a second solder resist layer on the structure shown in FIG. 3.

Referring to FIG. 4, in step S4, a second solder resist layer 60 is formed on the first solder resist layer 40, the second solder resist layer 60 infills the groove 43, and is not in contact with the mounting surface 127 of the bond pad 125, and the circuit board 100 is thereby obtained.

In the embodiment, the second solder resist layer 60 infills the groove 43, partially or completely covers the surface of the first solder resist layer 40 facing away from the wiring board 10, and does not make contact with the opening 41.

The second solder resist layer 60 is made of ink, such as soft ink or hard ink. In the embodiment, in order to give light-reflecting properties to the second solder resist layer 60, the second solder resist layer 60 is made of white thermosetting ink. In an alternative embodiment, a reflectivity of the second solder resist layer 60 is greater than a reflectivity of the first solder resist layer 40, and a thickness of the second solder resist layer 60 is greater than a thickness of the first solder resist layer 40, so that the circuit board 100 has a high reflectivity.

Figure 5:
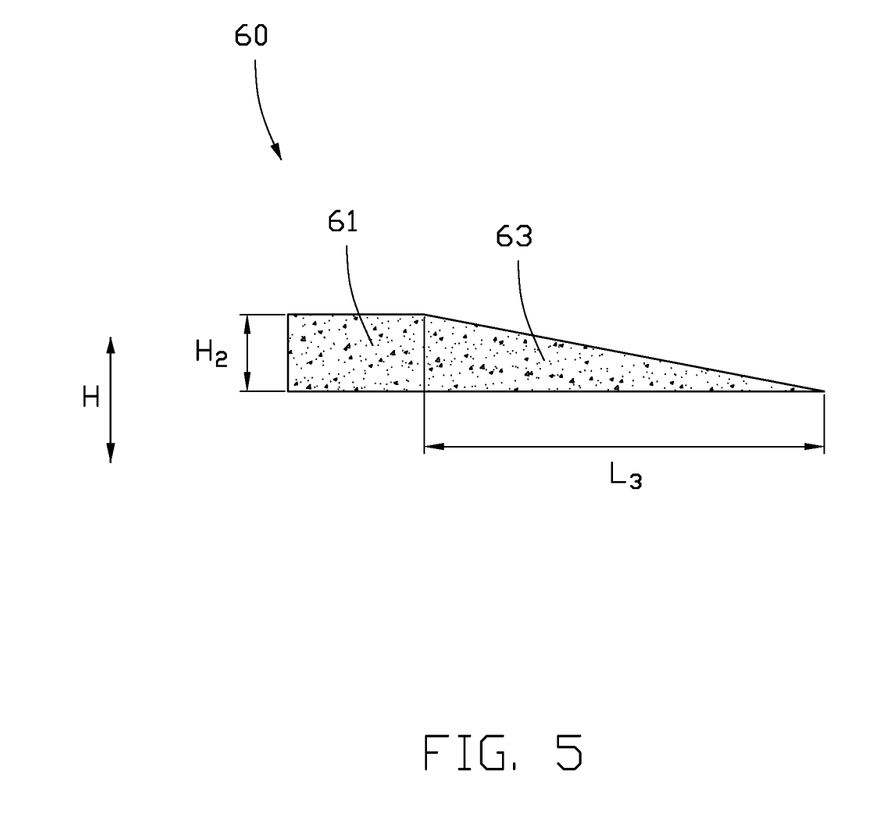
FIG. 5 is a cross-sectional view of a second solder resist layer formed on a horizontal plane.

When the second solder resist layer 60 is formed using ink, the ink will overflow on both sides from an initial printing position due to the fluidity of the ink, forming an overflowed portion with a gradually decreasing thickness. Referring to FIG. 5, the second solder resist layer 60 includes a printing portion 61 and an overflowed portion 63 connected to each other. The printing portion 61 is formed of ink printed at an initial printing position, and the overflowed portion 63 is formed of ink which overflowed from the initial printing position. The cross section of the overflowed portion 63 along a thickness direction H of the circuit board 100 is substantially triangular. In the thickness direction H of the circuit board 100, the printing portion 61 has a thickness of $H_2$ μm, that is, the maximum thickness of the overflowed portion 63 is preset at $H_2$ μm. In the width direction L of the circuit board 100, the width of the overflowed portion 63 is preset at $L_3$ μm.

In the embodiment, the printing portion 61 refers to a portion of the second solder resist layer 60 formed on the first portion 45 of the first solder resist layer 40, and the overflowed portion 63 refers to the remaining portion of the second solder resist layer 60.

Referring to FIG. 4, in the thickness direction H of the circuit board 100, the first solder resist layer 40 has a thickness of $H_1$ μm, and in a width direction L of the circuit board 100, the groove 43 has a width of $L_1$ μm, the second portion 46 of the first solder resist layer 40 has a thickness of $L_2$ μm.

When the groove 43 is formed on the first solder resist layer 40, a value of processing error in the width direction L of the groove 43 is $P_1$ μm. When the second solder resist layer 60 is formed on the first solder resist layer 40, a value of processing error in the width direction L of the second solder resist layer 60 is $P_2$μm. In this embodiment, $P_1$ is approximately 0.05, and $P_2$ is approximately 0.2.

When the second solder resist layer 60 completely infills the groove 43 and exactly completely covers the surface of the first solder resist layer 40 facing away from the circuit board 10, that is when the edge of the overflowed portion 63 of the second solder resist layer 60 is aligned with the edge of the second portion 46 of the first solder resist layer 40, the volume of the overflowed portion 63 needs to be smaller than a maximum volume of ink carried in the groove 43 and on the second portion 46. At this time, a preset cross-sectional area of the overflowed portion 63 along the thickness direction H is set as $H_2 \times L_3 \times 0.5$, and the maximum preset cross-sectional area of the overflowed portion 63 is $H_2 \times (L_1+L_2-P_1-P_2)+H_1 \times (L_1-P_1-P_2)$.

Figure 6:
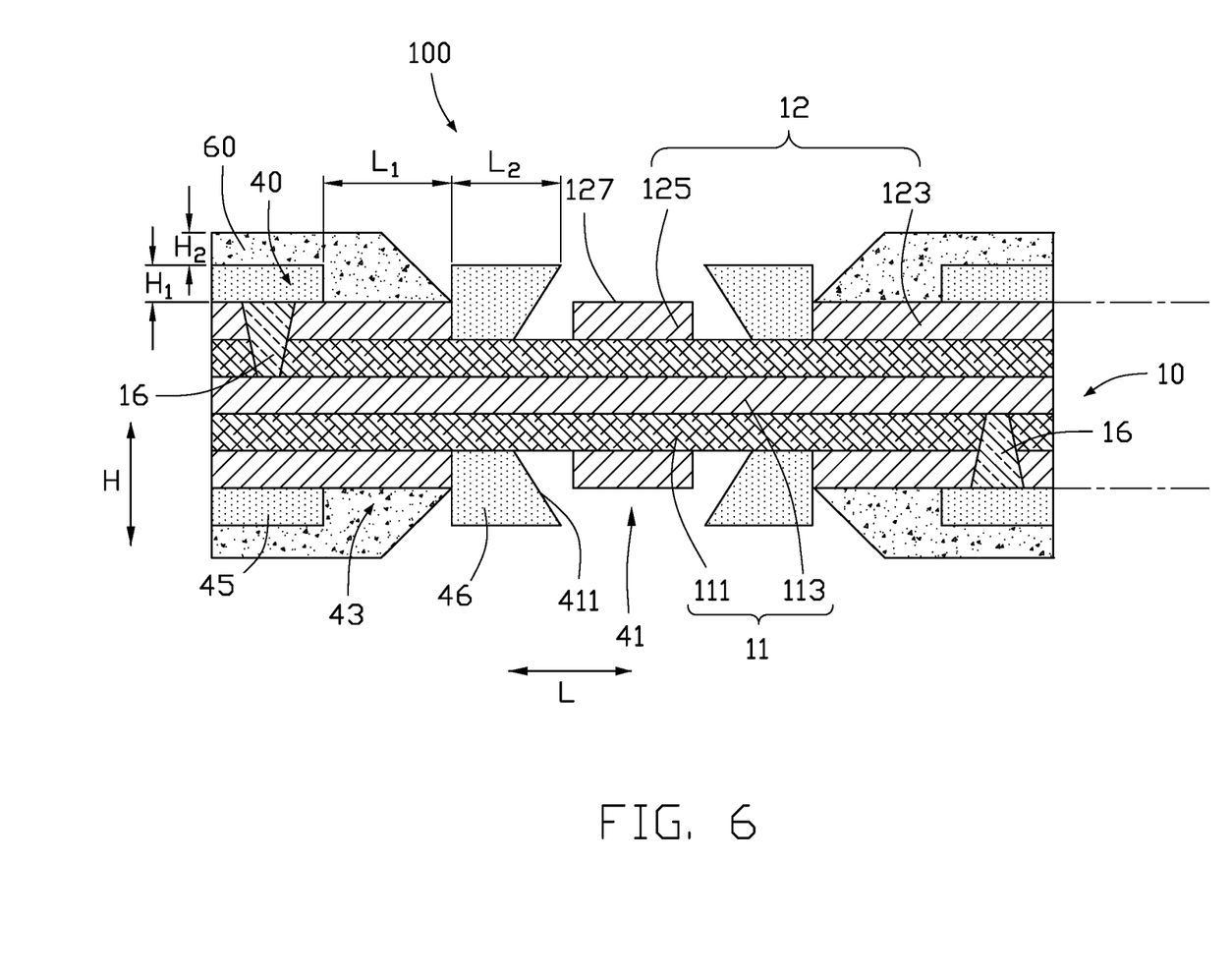
FIG. 6 is a cross-sectional view of a circuit board having a high reflectivity according to another embodiment in the present disclosure.

Referring to FIG. 6, when the overflowed portion 63 exactly infills the groove 43, that is when the overflowed portion 63 exactly completely covers the bottom of the groove 43, a preset cross-sectional area of the overflowed portion 63 along the thickness direction H is set as $H_2 \times (L_3-P_1-P_2)$ 0.5, and the minimum preset cross-sectional area of the overflowed portion 63 is $H_1 \lambda L_1$. To enable the second solder resist layer 60 to infill the groove 43 without contacting the opening 41, the preset cross-sectional area of the overflowed portion 63 along the thickness direction H needs to satisfy formulas $H_2 \times L_3 \times 0.5 \leq H_2 \times (L_1+L_2-P_1-P_2)+H_1 \times (L_1-P_1-P_2)$, and $H_2 \times (L_3-P_1-P_2) 0.5 \geq H_1 \times L_1$.

In an alternative embodiment, the second solder resist layer 60 further fills in the opening 41.

Referring to FIG. 4, to enable the second solder resist layer 60 to fill in the opening 41, when the second solder resist layer 60 completely covers the surface of the first solder resist layer 40 facing away from the circuit board 10, a preset cross-sectional area of the overflowed portion 63 along the thickness direction H is set as $H_2 \times (L_3-P_1-P_2) \times 0.5$, and the minimum preset cross-sectional area of the overflowed portion 63 is $H_2 \times (L_1+L_2)+H_1 \times L_1$.

Figure 7:
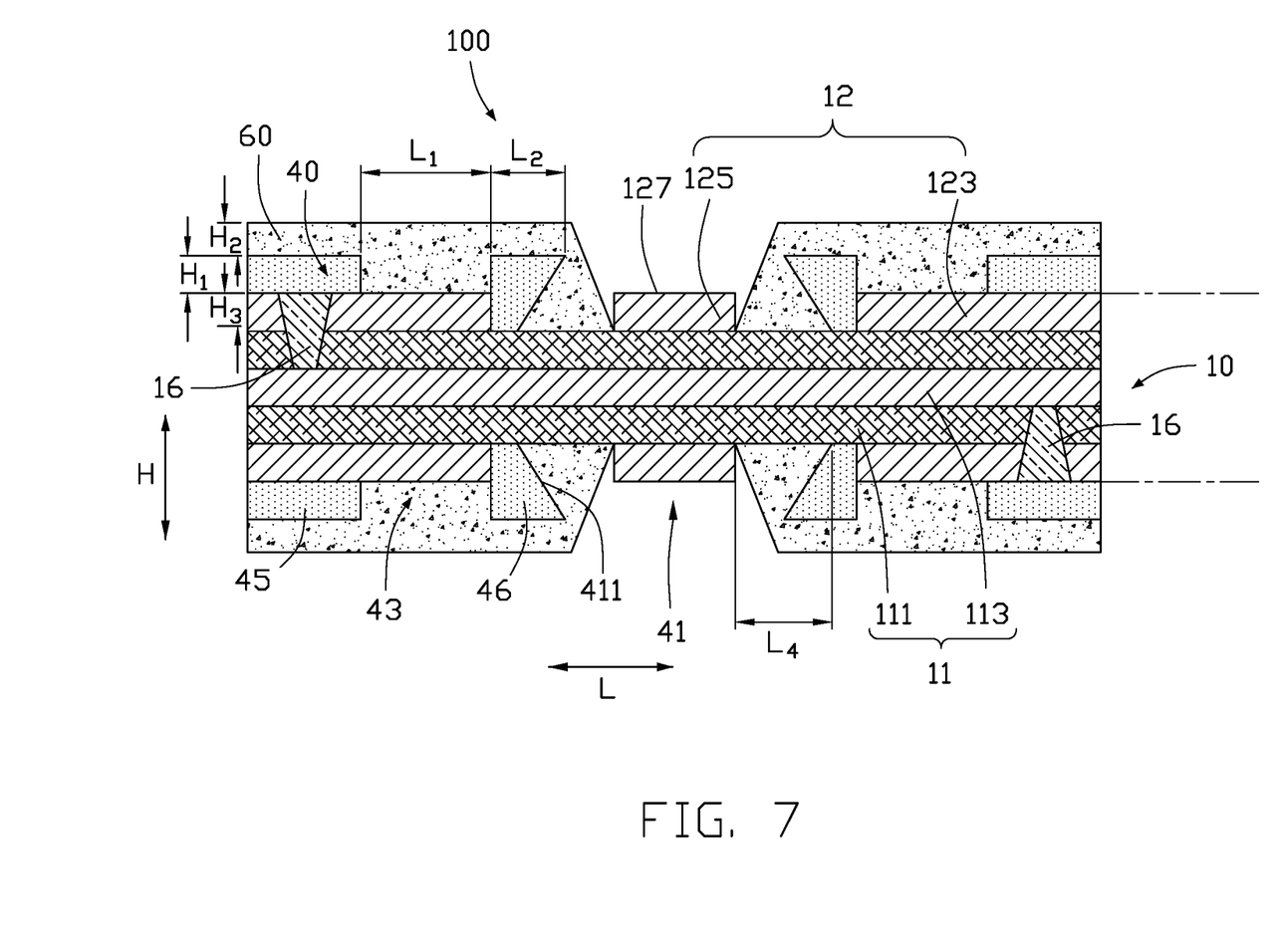
FIG. 7 is a cross-sectional view of a circuit board having a high reflectivity according to yet another embodiment in the present disclosure.

Referring to FIG. 7, the wiring layer 121 has a thickness of $H_3$ μm in the thickness direction H, the portion of the second solder resist layer 60 filling in the opening 41 has a maximum width of $L_3$ μm in the width direction L of the circuit board 100. When the second solder resist layer 60 infills the groove 43 completely covers the surface of the first solder resist layer 40 facing away from the wiring board 10, and exactly makes contact with the bond pad 125, a maximum preset cross-sectional area $H_2 \times L_3$ 0.5 of the overflowed portion 63 along the thickness direction H is $H_2 \times (L_2-P_1-P_2)+H_1 \times (L_1-P_1-P_2)+(H_1+H_3) \times L_4 \times 0.5$. To enable the second solder resist layer 60 further to infill the opening and not to make contact with the mounting surface 127 of the bond pad 125, the preset cross-sectional area of the overflowed portion 63 along the thickness direction H needs to satisfy formulas $$H_2 \times (L_3-P_1-P_2) \times 0.5 \geq H_2 \times (L_1+L_2)+H_1 \times L_1, \text{ and}$$

$$H_2 \times L_3 \times 0.5 \leq H_2 \times (L_1+L_2-P_1-P_2)+H_1 \times (L_1-P_1-P_2)+(H_1+H_3) \times L_4 \times 0.5.$$

Referring to FIG. 4, in one embodiment, a circuit board 100 includes a wiring board 10, a first solder resist layer 40, and a second solder resist layer 60.

The wiring board 10 includes a substrate 11 and a wiring layer 12 disposed on at least one side of the substrate 11. The wiring layer 12 is located on an outer side of the wiring board 10. In the embodiment, the wiring layer 12 is disposed on both sides of the substrate 11, and the wiring layer 12 is made of copper.

The substrate 11 may have a single-layer structure or a multi-layer structure, and may be a flexible board, a rigid board, or a flexible-rigid board. In the embodiment, the substrate 11 includes two insulating layers 111 and a wiring layer 113 sandwiched between the insulating layers 111. In an alternative embodiment, the number of insulating layer 111 and of wiring layer 113 in the substrate 11 may be set according to needs.

The insulating layer 111 includes at least one of prepreg including glass fiber and epoxy resin, polyimide, polyethylene terephthalate, polyethylene naphthalate.

The wiring board 10 further includes a plurality of conductive structures 16 for electrically connecting various wiring layers. Specifically, each of the conductive structures 16 passes through one wiring layer 12 and one insulating layer 111, and electrically connects the wiring layer 12 on the outer side and the wiring layer 113 of the substrate 11.

The wiring layer 12 includes wiring 123 and a bond pad 125 spaced from the wiring 123. The bond pad 125 includes a mounting surface 127 on an outer side. A surface-mounted component, such as a LED, is mounted on the mounting surface 127 of the bond pad 125 to be electrically connected to the wiring board 10. The wiring 123 is not in contact with the surface-mounted component. The wiring 123 is configured to transmit electrical signals.

The first solder resist layer 40 completely covers the wiring layer 12 and infills the gap between the bond pad 125 and the wiring 123. The first solder resist layer 40 may be formed by printing.

The first solder resist layer 40 is made of ink, such as soft ink or hard ink. In the embodiment, the first solder resist layer 40 is made of white photosensitive ink for high reflectivity and to enable the first solder resist layer 40 to be patterned by using a photo-lithography method.

The first solder resist layer 40 has an opening 41 and a groove 43, and the bond pad 125 is exposed from the opening 41 and spaced from the first solder resist layer 40.

The opening 41 passes through the first solder resist layer 40, and a part of the substrate 11 and the bond pad 125 are exposed from the opening 41. The opening 41 includes a sidewall 411 spaced from the bond pad 125. In the embodiment, the sidewall 411 is inclined relative to the substrate 11.

The groove 43 passes through the first solder resist layer 40, and the wiring 123 is exposed from the groove 43. The groove 43 is arranged around the opening 41, and divides and separates the first solder resist layer 40 into a first portion 45 and a second portion 46. The second portion 46 is arranged adjacent to the bond pad 125. In the embodiment, the second portion 46 is received in the gap between the bond pad 125 and the wiring 123. In an alternative embodiment, projections of the second portion 46 and the bond pad 125 along a thickness direction H of the circuit board 100 do not overlap.

The opening 41 and the groove 43 may be formed on the first solder resist layer 40 by using a photo-lithography method.

The second solder resist layer 60 covers the first solder resist layer 40, infills the groove 43, and does not make contact with the mounting surface 127 of the bond pad 125.

In the embodiment, the second solder resist layer 60 infills the groove 43, partially or completely covers the surface of the first solder resist layer 40 facing away from the wiring board 10, and does not make contact with the opening 41.

The second solder resist layer 60 is made of ink, such as soft ink or hard ink. In the embodiment, the second solder resist layer 60 is made of white thermosetting ink for high reflectivity of light. In an alternative embodiment, a reflectivity of the second solder resist layer 60 is greater than a reflectivity of the first solder resist layer 40, and a thickness of the second solder resist layer 60 is greater than a thickness of the first solder resist layer 40, so that the circuit board 100 has a high reflectivity.

When the second solder resist layer 60 is formed using ink, the ink will overflow to both sides from an initial printing position due to the fluidity of the ink, forming an overflowed portion with a gradually decreasing thickness. Referring to FIG. 5, the second solder resist layer 60 includes a printing portion 61 and an overflowed portion 63 connected to each other. The printing portion 61 is formed of ink printed at an initial printing position, the overflowed portion 63 is formed of ink overflowed from the initial printing position. The cross section of the overflowed portion 63 along a thickness direction H of the circuit board 100 is substantially triangular. In the thickness direction H of the circuit board 100, the printing portion 61 has a thickness of $H_2$ μm, that is, the maximum thickness of the overflowed portion 63 is preset at $H_2$ μm. In the width direction L of the circuit board 100, the width of the overflowed portion 63 is preset at $L_3$ μm.

In the embodiment, the printing portion 61 refers to a portion of the second solder resist layer 60 formed on the first portion 45 of the first solder resist layer 40, and the overflowed portion 63 refers to the remaining portion of the second solder resist layer 60.

Referring to FIG. 4, in the thickness direction H of the circuit board 100, the first solder resist layer 40 has a thickness of $H_1$ μm, and in a width direction L of the circuit board 100 the groove 43 has a width of $L_1$ μm, the second portion 46 of the first solder resist layer 40 has a thickness of $L_2$ μm.

When the groove 43 is formed on the first solder resist layer 40, a value of processing error in the width direction L of the groove 43 is $P_1$ μm. When the second solder resist layer 60 is formed on the first solder resist layer 40, a value of processing error in the width direction L of the second solder resist layer 60 is $P_2$ μm. In this embodiment, $P_1$ is approximately 0.05, and $P_2$ is approximately 0.2.

When the second solder resist layer 60 completely infills the groove 43 and exactly completely covers the surface of the first solder resist layer 40 facing away from the circuit board 10, that is when the edge of the overflowed portion 63 of the second solder resist layer 60 is aligned with the edge of the second portion 46 of the first solder resist layer 40, the volume of the overflowed portion 63 needs to be smaller than a maximum volume of ink carried on the groove 43 and the second portion 46. At this time, a preset cross-sectional area of the overflowed portion 63 along the thickness direction H is set as $H_2 \times L_3 \times 0.5$, and the maximum preset cross-sectional area of the overflowed portion 63 is $H_2 \times (L_1 + L_2 - P_1 - P_2) + H_1 \times (L_1 - P_1 - P_2)$.

Referring to FIG. 6, when the overflowed portion 63 exactly infills the groove 43, that is when the overflowed portion 63 exactly completely covers the bottom of the groove 43, a preset cross-sectional area of the overflowed portion 63 along the thickness direction H is set as $H_2 \times (L_3 - P_1 - P_2) \times 0.5$, and the preset cross-sectional area of the overflowed portion 63 minimum $L_1$. For the second solder resist layer 60 to infill the groove 43 without contacting the opening 41, the preset cross-sectional area of the overflowed portion 63 along the thickness direction H needs to satisfy the formulas $H_2 \times L_3 \times 0.5 \leq H_2 \times (L_1 + L_2 - P_1 - P_2) + H_1 \times (L_1 - P_1 - P_2)$, and $H_2 \times (L_3 - P_1 - P_2) \times 0.5 \geq H_1 \times L_1$.

In an alternative embodiment, the second solder resist layer 60 further fills the opening 41.

Referring to FIG. 4, for the second solder resist layer 60 to fill in the opening 41, when the second solder resist layer 60 exactly completely covers the surface of the first solder resist layer 40 facing away from the circuit board 10, a preset cross-sectional area of the overflowed portion 63 along the thickness direction H is set as $H_2 \times (L_3-P_1-P_2) \times 0.5$, and the minimum preset cross-sectional area of the overflowed portion 63 is $H_2 \times (L_1+L_2)+H_1 \times L_1$.

Referring to FIG. 7, the wiring layer 121 has a thickness of $H_3$ μm in the thickness direction H, and the portion of the second solder resist layer 60 filling in the opening 41 has a maximum width of $L_3$ μm in the width direction L of the circuit board 100. When the second solder resist layer 60 infills the groove 43, is completely covering the surface of the first solder resist layer 40 facing away from the wiring board 10, and exactly makes contact with the bond pad 125, a preset cross-sectional area of the overflowed portion 63 along the thickness direction H is set as $H_2 \times L_3 \times 0.5$, and the maximum preset cross-sectional area of the overflowed portion 63 is $H_2 \times (L_1+L_2-P_1-P_2)+H_1 \times (L_1-P_1-P_2)+(H_1+H_3) \times L_4 \times 0.5$. For the second solder resist layer 60 to infill the opening and not to make contact with the mounting surface 127 of the bond pad 125, the preset cross-sectional area of the overflowed portion 63 along the thickness direction H needs to satisfy formulas $H_2 \times (L_3-P_1-P_2) \times 0.5 \geq H_2 \times (L_1+L_2)+H_1 \times L_1$, and $H_2 \times L_3 \times 0.5 \leq H_2 \times (L_1+L_2-P_1-P_2)+H_1 \times (L_1-P_1-P_2)+(H_1+H_3) \times L_4 \times 0.5$.

In the circuit board having a high reflectivity and the method making same, the groove 43 is defined on the first solder resist layer 40, to receive the overflowed ink during the forming of the second solder resist layer 60, and so preventing the second solder resist layer 60 from touching the mounting surface 127 of the bond pad 125. Therefore, contamination of the bond pad 125 by the second solder resist layer 60 is prevented, and the surface-mounted component can be directly mounted on the bond pad 125 of the circuit board 100. By controlling the amount of ink used to form the second solder resist layer 60, the preset cross-sectional area of the overflowed portion 63 along the thickness direction H satisfies formula $H_2 \times L_3 \times 0.5 \leq H2 \times (L1+L2-P1-P2)+H1 \times (L1-P1-P2)$, and $H2 \times (L3-P1-P2) \times 0.5 \geq H1 \times L1$, or satisfies formula $H2 \times (L3-P1-P2) \times 0.5 \geq H2 \times (L1+L2)+H1 \times L1$, and $H2 \times L3 \times 0.5 \leq H2 \times (L1+L2-P1-P2)+H1 \times (L1-P1-P2)+(H1+H3) \times L4 \times 0.5$, the second solder resist layer 60 being prevented from touching the mounting surface 127 of the bond pad 125.

Further, in the circuit board 100, the first solder resist layer 40 and the second solder resist layer 60 are stacked in order on an outer side of the wiring board 10, so an even greater light-reflectiveness is conferred on the circuit board 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A circuit board having a high reflectivity comprising:
   a wiring board comprising a wiring layer on an outer side, the wiring layer comprising wiring and a bond pad spaced from the wiring, the bond pad comprising a mounting surface on an outer side;
   a first solder resist layer covering the wiring layer and defining an opening and a groove, the bond pad being exposed from the opening and spaced from the first solder resist layer; and
   a second solder resist layer covering the first solder resist layer and infilling the groove, wherein the second solder resist layer does not contact the mounting surface.

2. The circuit board of claim 1, wherein the groove surrounds the opening.

3. The circuit board of claim 2, wherein the groove divides the first solder resist layer into a first portion and a second portion spaced from the first portion, the second portion is adjacent to the bond pad, and projections of the second portion and the bond pad along a thickness direction of the circuit board do not overlap.

4. The circuit board of claim 1, wherein the second solder resist layer further fills in the opening.

5. The circuit board of claim 1, wherein the first solder resist layer comprises white photosensitive ink, and the second solder resist layer comprise white thermosetting ink.

6. A method for manufacturing a circuit board having a high reflectivity comprising:
   providing a wiring board comprising a wiring layer on an outer side, the wiring layer comprising wiring and a bond pad spaced from the wiring, the bond pad defining a mounting surface on an outer side;
   forming a first solder resist layer on the wiring layer;
   forming an opening and a groove on the first solder resist layer, the bond pad being exposed from the opening and spaced from the first solder resist layer;
   forming a second solder resist layer on the first solder resist layer, the second solder resist layer infilling the groove and not contacting the mounting surface of the bond pad, thereby obtaining the circuit board.

7. The method of claim 6, wherein the groove is arranged to surround the opening.

8. The method of claim 7, further comprising dividing the first solder resist layer by the groove into a first portion and a second portion spaced from the first portion, the second portion is adjacent to the bond pad, and projections of the second portion and the bond pad along a thickness direction of the circuit board do not overlap.

9. The method of claim 6, wherein the second solder resist layer further fills in the opening.

10. The method of claim 6, wherein the first solder resist layer comprises white photosensitive ink, and the second solder resist layer comprise white thermosetting ink.

* * * * *